United States Patent
Ehrmann et al.

(10) Patent No.: US 6,777,645 B2
(45) Date of Patent: Aug. 17, 2004

(54) HIGH-SPEED, PRECISION, LASER-BASED METHOD AND SYSTEM FOR PROCESSING MATERIAL OF ONE OR MORE TARGETS WITHIN A FIELD

(75) Inventors: Jonathan S. Ehrmann, Sudbury, MA (US); James J. Cordingley, Littleton, MA (US); Donald V. Smart, Boston, MA (US); Donald J. Svetkoff, Ann Arbor, MI (US)

(73) Assignee: GSI Lumonics Corporation, Billerica, MA (US)

( * ) Notice: Subject to any disclaimer, the term of this patent is extended or adjusted under 35 U.S.C. 154(b) by 107 days.

(21) Appl. No.: 10/107,027

(22) Filed: Mar. 27, 2002

(65) Prior Publication Data

US 2002/0170898 A1 Nov. 21, 2002

Related U.S. Application Data

(60) Provisional application No. 60/279,644, filed on Mar. 29, 2001.

(51) Int. Cl.$^7$ .......................... B23K 26/06; B23K 26/38
(52) U.S. Cl. ................................ 219/121.73; 219/121.7
(58) Field of Search ........................ 219/121.7, 121.71, 219/121.73, 121.74, 121.75

(56) References Cited

U.S. PATENT DOCUMENTS

| | | | |
|---|---|---|---|
| 3,941,973 A | * | 3/1976 | Luck, Jr. et al. |
| 4,397,527 A | | 8/1983 | Geyer |
| 4,410,237 A | | 10/1983 | Veldkamp |
| 4,861,964 A | | 8/1989 | Sinohara |
| 4,941,093 A | | 7/1990 | Marshall et al. |
| 5,265,114 A | | 11/1993 | Sun et al. |
| 5,300,756 A | | 4/1994 | Cordingley |
| 5,463,200 A | | 10/1995 | James et al. |
| 5,494,781 A | | 2/1996 | Ohtani et al. |
| 5,524,018 A | | 6/1996 | Adachi |
| 5,632,083 A | | 5/1997 | Tada et al. |
| 5,662,822 A | * | 9/1997 | Tada et al. ............. 219/121.73 |
| 5,864,430 A | | 1/1999 | Dicket et al. |
| 5,925,271 A | | 7/1999 | Pollack et al. |
| 5,998,759 A | | 12/1999 | Smart |
| 6,057,180 A | | 5/2000 | Sun et al. |
| 6,144,118 A | | 11/2000 | Cahill et al. |
| 6,181,728 B1 | | 1/2001 | Cordingley et al. |
| 6,225,595 B1 | * | 5/2001 | Wei et al. ............. 219/121.75 |
| 6,341,029 B1 | | 1/2002 | Fillion et al. |
| 6,472,295 B1 | | 10/2002 | Morris et al. |
| 6,518,543 B1 | * | 2/2003 | Benz et al. ............. 219/121.73 |
| 6,639,177 B2 | * | 10/2003 | Ehrmann et al. ...... 219/121.68 |
| 2002/0005396 A1 | | 1/2002 | Baird et al. |
| 2003/0042230 A1 | | 3/2003 | Gross et al. |

FOREIGN PATENT DOCUMENTS

| | | | |
|---|---|---|---|
| JP | 7-68392 A | * | 3/1995 |
| JP | 7-80674 A | * | 3/1995 |

OTHER PUBLICATIONS

Link Cutting/Making, Handbook of Laser Materials Processing, Chapter 19, pp. 595–615, ISBN 0–912035–15–3.

* cited by examiner

Primary Examiner—Geoffrey S. Evans
(74) Attorney, Agent, or Firm—Brooks Kushman P.C.

(57) ABSTRACT

A precision, laser-based method and system for high-speed, sequential processing of material of targets within a field are disclosed that control the irradiation distribution pattern of imaged spots. For each spot, a laser beam is incident on a first anamorphic optical device and a second anamorphic optical device so that the beam is controllably modified into an elliptical irradiance pattern. The modified beam is propagated through a scanning optical system with an objective lens to image a controlled elliptical spot on the target. In one embodiment, the relative orientations of the devices along an optical axis are controlled to modify the beam irradiance pattern to obtain an elliptical shape while the absolute orientation of the devices controls the orientation of the elliptical spot.

55 Claims, 11 Drawing Sheets

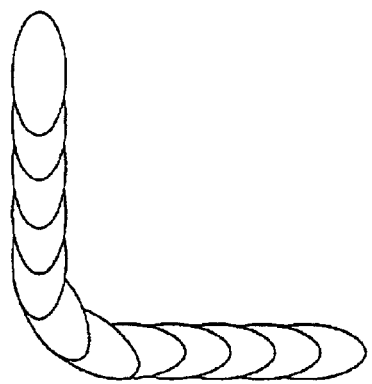 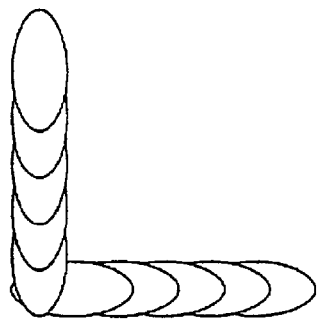 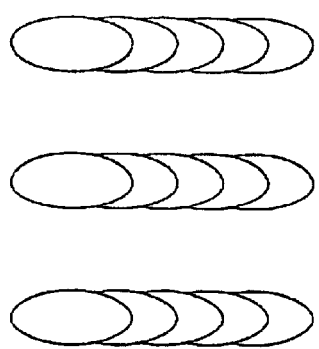
*Fig. 13a*  *Fig. 13b*  *Fig. 13c*
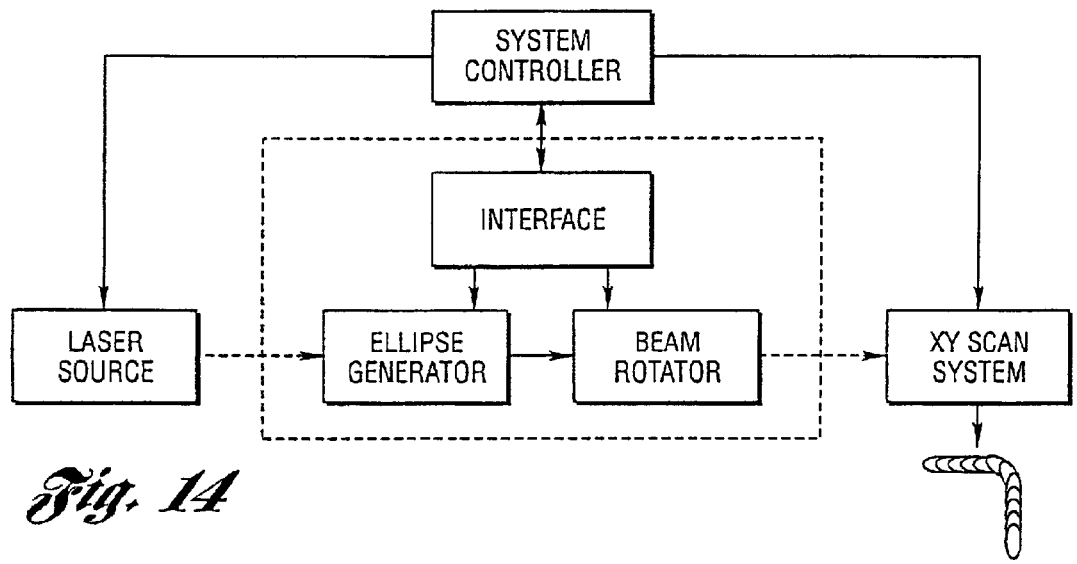
*Fig. 14*
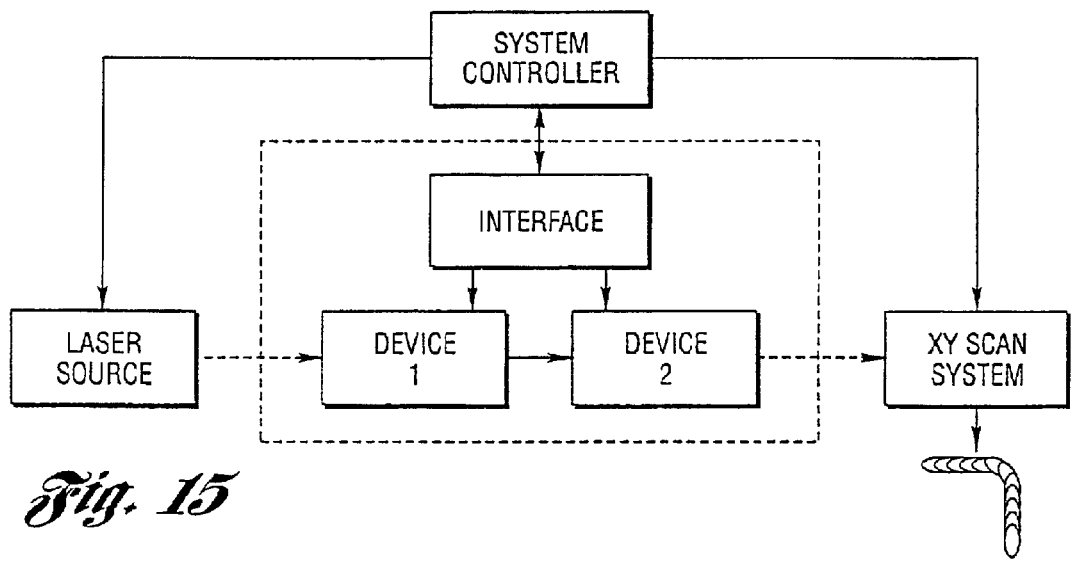
*Fig. 15*

HIGH-SPEED, PRECISION, LASER-BASED METHOD AND SYSTEM FOR PROCESSING MATERIAL OF ONE OR MORE TARGETS WITHIN A FIELD

CROSS-REFERENCE TO RELATED APPLICATIONS AND PATENTS

This application claims the benefit of U.S. provisional application Serial No. 60/279,644, filed Mar. 29, 2001, entitled "Method and System for Severing Highly Conductive Micro-Structures." This application is also related to U.S. patent application Ser. No. 10/107,028, now U.S. Pat. No. 6,639,177, filed on the same day as this application, and entitled "Method and System for Processing One or More Microstructures of a Multi-Material Device." This application hereby incorporates the following U.S. patents by reference herein: U.S. Pat. Nos. 5,300,756; 6,144,118; 6,181,728; and 5,998,759.

BACKGROUND OF THE INVENTION

1. Field of the Invention

The present invention relates to the field of laser material processing methods and systems, and specifically, to scanned laser processing methods and systems for the processing of semiconductor wafers, electronic substrates, and workpieces to be laser micromachined.

2. Background Art

Conventionally, round spots have been used for a majority of precision-scanned, laser-processing applications. Many laser sources such as Nd:YAG lasers produce round Gaussian beams, which, when imaged through conventional spherical optics, produce round spots. These spots are scanned across target sites to process material, and the resulting laser-material interaction removes or otherwise alters the targeted material. In many laser-processing applications, system throughput is limited by the average power, the substrates' fluence damage threshold, and, in pulsed systems, the laser q-rate and the laser pulse characteristics.

Exemplary micromachining operations include link blowing of redundant memory circuits, laser trimming, and circuit fabrication. For processing applications such as blowing sub-micron width fuses on a memory device, efficient coupling of energy to a narrow fuse with minimum lateral and substrate damage is desirable. Large round spots may cause undesirable adjacent link damage as shown in FIG. 19a. While smaller spots allow finer pitched fuses to be processed, the potential for substrate damage can increase with the higher fluence of a decreasing spot size as shown in FIG. 19b. When micromachining a line made from a sequence of small laser spots, the spot overlap or so-called "bite size" and q-rate are two of the process characteristics that determine maximum scan velocity. Laser trimming applications requiring a wide kerf width may require multiple passes with a small spot when the peak fluence of a larger spot is inadequate. In the field of a lead frame fabrication, wherein a fine pitch lead on a large lead count device is machined, a rotating elongated spot is used as described in U.S. Pat. No. 5,632,083.

Out-of-round spots are often considered as system defects that limit process quality. Much effort has been expended in the field of laser optics to improve beam quality, to circularize beams from diode lasers, and to design and implement highly corrected optics for diffraction-limited systems. Vector diffraction effects used for beam-shape compensation are described in U.S. Pat. No. 4,397,527.

Many techniques are known for beam shaping and spot shaping. One method is a phase plate used with a round beam to modify the spot shape for processing memory fuses as shown in the upper portion of FIG. 20 and as taught by Cordingley in U.S. Pat. No. 5,300,756. The primary effect using this simple type of phase plate is to create a top-hat distribution profile as shown in the lower portion of FIG. 20. However, techniques for creating an oblong spot are also described.

Use of an anamorphic spot with dithering for shaping a laser beam intensity profile is described in U.S. Pat. No. 6,341,029. The anamorphic spot allows sharper line edges to be formed with a narrowed spot width, while an increased spot length maintains desired total power without exceeding process limits on integrated power per unit substrate area.

Veldkamp in U.S. Pat. No. 4,410,237 describes a diffraction grating and prism method for transforming a round Gaussian beam to elongated flat-top profiles.

Dickey in U.S. Pat. No. 5,864,430 describes a phase-based method for transforming a round Gaussian beam to a flat-top, square, or rectangular-shaped spot.

Yet another technique is creating an array of spots such as disclosed by James in U.S. Pat. No. 5,463,200.

Another well known technique is the imaged aperture mask.

Apodization is yet another simple technique to modify the beam shape and thereby spot shape.

Published U.S. patent application in the name of Baird et al., US 2002/0005396 A1, discloses a UV laser system wherein an optics module is provided to enhance shape quality of laser beams.

Sun et al. in U.S. Pat. No. 5,265,114 describe a method and system for selectively laser processing a target structure of one or more materials of a multi-material, multi-layer device.

Sun et al. in U.S. Pat. No. 6,057,180 describe a method for severing electrically conductive links with ultraviolet laser output.

SUMMARY OF THE INVENTION

It is an object of at least one embodiment of this invention to sequentially and relatively position a modified laser beam into at least one spot having an adjustable aspect ratio for laser material processing of one or more targets within a field in a variety of micromachining applications.

It is an object of at least one embodiment of the present invention to correct system-induced, spot non-uniformity to create precise round or elongated spots such as elliptical spots.

In carrying out the above objects and other objects of the present invention, a high-speed, precision, laser-based method for processing material of at least one target within a field is disclosed. The method includes generating a laser beam along a propagation path, and controllably modifying the laser beam to obtain a modified laser beam. The method also includes sequentially and relatively positioning the modified laser beam into at least one spot at each target within the field to process the material of each target wherein the at least one spot has a set of desired spatial characteristics including an adjustable aspect ratio which are obtained by the step of controllably modifying.

The at least one spot may have a pair of axes and the modified laser beam may be focused to a substantially common point in both axes.

The adjustable aspect ratio may be greater than 0.1 but less than 10.

Multiple targets may be within the field.

The step of sequentially and relatively positioning may include the step of vector scanning the modified laser beam.

The step of controllably modifying the laser beam may be repeated during the step of sequentially and relatively positioning the modified laser beam so that the at least one spot has at least a second set of desired spatial characteristics.

The set of desired spatial characteristics may be determined based on at least one target characteristic of each target.

The set of desired spatial characteristics may also be determined based on at least one target material property of each target, or based on at least one process variable.

The set of desired spatial characteristics may further be determined based on at least one desired laser material processing characteristic.

The step of generating may include the step of shaping the laser beam to change the aspect ratio and to obtain a modified beam having a first elongated irradiance pattern with a first orientation wherein the modified beam is delivered and focused into the at least one spot.

The step of generating may also include the step of further shaping the modified beam to obtain a laser beam having a second elongated irradiance pattern with a second orientation.

The step of controllably modifying may control absolute orientation of the first and second orientations based on target orientation.

The step of shaping may further include the step of controlling relative orientation of the first and second orientations.

The step of sequentially and relatively positioning may deliver and focus the beam into a plurality of spots extending along a laser processing path wherein the aspect ratio and orientation of each of the spots is based on predetermined dimensions of each target and target orientation.

The laser processing path may be a curvilinear path.

Each of the spots may be an elongated spot having a major axis and wherein the major axis of at least one of the spots is aligned with the laser processing path.

Each of the spots may also be an elongated spot having a major axis and wherein the major axis of at least one of the spots is transverse the laser processing path.

An aspect ratio and orientation of the at least one spot may be controlled based on predetermined dimensions of each target and target orientation.

The step of generating may include the step of filtering the laser beam to obtain an initially modified spot shape.

The step of generating may also include the step of filtering the laser beam to obtain an initially modified spot irradiance profile.

The processing may be micromachining and may include semiconductor link removal, laser trimming, laser drilling or laser etching.

The step of sequentially and relatively positioning may deliver and focus the modified beam into a spot which is scanned along a laser processing path wherein an aspect ratio and orientation of the spot is based on predetermined dimensions of each target and target orientation.

The modified beam may have an irradiance pattern of an elliptical Gaussian beam.

The modified beam may have an irradiance pattern of a top hat in one direction and Gaussian in a direction orthogonal to the one direction.

Further in carrying out the above objects and other objects of the present invention, a high-speed, precision system for processing material of at least one target having predetermined dimensions and a characteristic within a field is disclosed. The system includes a laser source for generating a laser beam along a propagation path having an irradiance pattern with an aspect ratio and an orientation in a plane substantially perpendicular to the propagation path. A controller generates control signals including orientation control signals based on the characteristic. A first subsystem is disposed in the propagation path for shaping the laser beam based on the predetermined dimensions to change the aspect ratio and obtain a modified beam. A second subsystem controllably changes the orientation of the irradiance pattern based on the orientation control signals. A beam delivery and focusing subsystem sequentially positions and focuses the modified beam into at least one spot on each target to process the material of each target.

The first subsystem may include a first anamorphic optical device for shaping the laser beam to obtain an initially modified laser beam having a first elongated irradiance pattern with a first orientation.

The first subsystem may also include a second anamorphic optical device for further shaping the initially modified laser beam to obtain the modified beam having a second elongated irradiance pattern with a second orientation.

The second subsystem may include at least one actuator for moving the anamorphic optical devices to control absolute orientation of the devices in response to the orientation control signals.

One actuator may move one of the anamorphic optical devices to control relative orientation of the devices in response to the control signals.

The beam delivery and focusing subsystem may sequentially position and focus the modified beam to a plurality of spots extending along a laser processing path wherein the aspect ratio and the orientation of each of the spots is based on the predetermined dimensions and target orientation.

The laser processing path may be a curvilinear path.

Each of the spots may be an elongated spot having a major axis wherein the major axis of at least one of the spots is aligned with the laser processing path.

Each of the spots may further be an elongated spot having a major axis wherein the major axis of at least one of the spots is transverse the laser processing path.

The first subsystem may include an ellipse generator wherein the irradiance pattern of the modified beam is an elliptical irradiance pattern and the at least one spot is at least one elliptical spot.

The second subsystem may include a beam rotator for rotating the modified beam.

An aspect ratio and orientation of the at least one spot may be controlled based on the predetermined dimensions and target orientation.

The processing may be micromachining and may include semiconductor link removal, laser trimming, laser drilling or laser etching.

The system may compensate for system errors that would result in an out-of-round or an out-of-ellipse condition.

The first subsystem may include a fixed expander/rotator based on an in-line or compensated offset optical path.

The first subsystem may include a plurality of non-offset prism pairs.

The first subsystem may include a multi-element, spherocylindrical expander.

The system may further include a filter for filtering the laser beam to obtain an initially modified spot shape.

The second subsystem may include an adaptive optical element.

The first subsystem may include an adaptive optical element.

The system may further include a filter for filtering the laser beam to obtain an initially modified spot irradiance profile.

The beam delivery and focusing subsystem may sequentially position and focus the modified beam into a spot that is scanned along a laser processing path wherein the aspect ratio and orientation of the spot is based on the predetermined dimension and target orientation.

The irradiance pattern may be an elliptical Gaussian beam.

The irradiance pattern may be a top hat in one direction and Gaussian in a direction orthogonal to the one direction.

Further in carrying out the above objects and other objects of the present invention, a high-speed, precision, laser-based method for processing material of at least one target within a field is disclosed. The method includes the steps of: a) generating a laser beam along a propagation path; b) controllably modifying the laser beam to obtain a modified laser beam; c) relatively positioning the modified laser beam into at least one spot at a target within the field to process the material of the target wherein the at least one spot has a set of desired spatial characteristics including an adjustable aspect ratio which are obtained by step b); and d) repeating steps a) through c) for each target until the material of all targets within the field are processed.

The method may further includes the step of: e) evaluating at least one of process, material and target characteristics to obtain data wherein step b) is based on the data, and wherein step d) repeats steps a) through c) and step e) for each target until the material of all targets within the field are processed.

The above objects and other objects, features, and advantages of the present invention are readily apparent from the following detailed description of the best mode for carrying out the invention when taken in connection with the accompanying drawings.

BRIEF DESCRIPTION OF THE DRAWINGS

FIGS. 13a–13c show three sequences of elliptical spots: FIG. 13a the first sequence for use with targets having a rounded corner; FIG. 13b the second sequence for use with targets having a squared-off corner; and FIG. 13c for use when a series of parallel lines are machined in the target material;

FIG. 14 is a block diagram of a first embodiment of a system for material processing of targets of the present invention;

FIG. 15 is a block diagram of a second embodiment of the system;

FIGS. 24a–24d are schematic views of various patterns of circles and ellipses that can be formed by the use of the present invention for drilling applications.

DETAILED DESCRIPTION OF THE PREFERRED EMBODIMENTS

An aspect of the present invention involves laser processing of targets with a modified beam where spatial characteristics including aspect ratio of a spot are adjusted so that laser-material processing is performed in a desirable manner. Exemplary applications include, but are not limited to semiconductor link blowing, resistor trimming, laser drilling and various spot transformations.

Figure 19A:
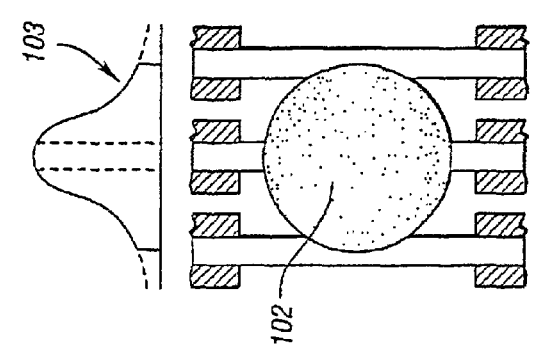
FIG. 19a is a top plan schematic view of a large laser spot which causes adjacent link damage together with a corresponding cross-section of its intensity profile.
Figure 19B:
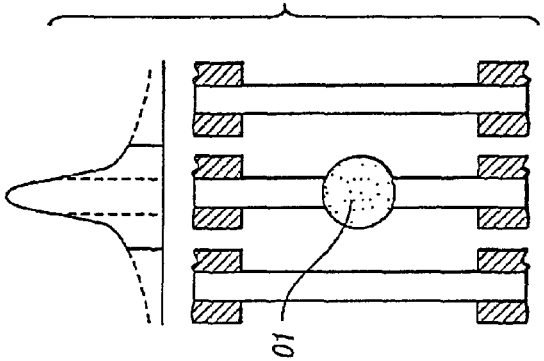
FIG. 19b is a top plan schematic view of a small laser spot which causes substrate change together with a corresponding cross-section of its intensity profile.
Figure 19C:
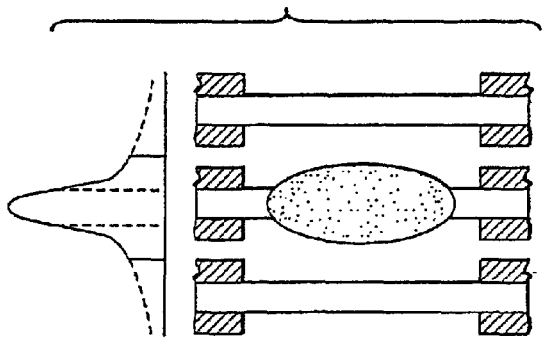
FIG. 19c is a top plan schematic view of an aligned elliptical spot of the present invention which minimizes damage together with a corresponding cross-section of its intensity profile.

For instance, the laser beam orientation and irradiance distribution may be substantially matched to the target geometry (e.g., FIGS. 19a–19d, a metal link 100 having a rectangular cross-section on a memory device) so as to efficiently couple the laser energy to the target (i.e., FIG. 19c) while reducing the background irradiance (e.g., Silicon substrate) and potential collateral damage. Such damage might occur through misalignment (FIG. 19d) or by overfilling with a round spot (FIG. 19a) where an adjacent link is irradiated. Though the situation in FIG. 19a appears extreme in the illustration, those skilled in the art of link blowing will appreciate that link pitch of a few microns is not uncommon and the even energy at or beyond the 13% (1/e**2) point of the spot 102 is undesirable. Links may typically have an aspect ratio of 8:1, with a narrow dimension smaller than or comparable to the laser processing wavelength. For instance, a link may be 0.6 um×5 um in dimension, with a thickness of less than 1 micron.

Figure 19D:
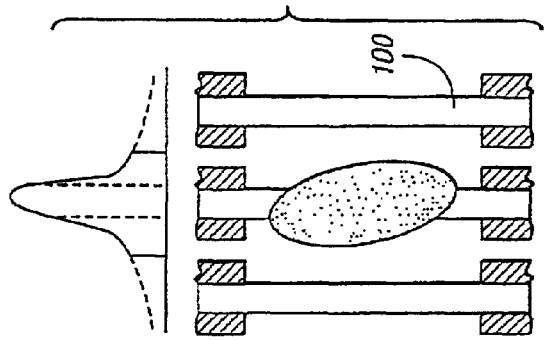
FIG. 19d is a top plan schematic view of a misaligned elliptical spot together with a corresponding cross-section of its intensity profile.
Figure 20:
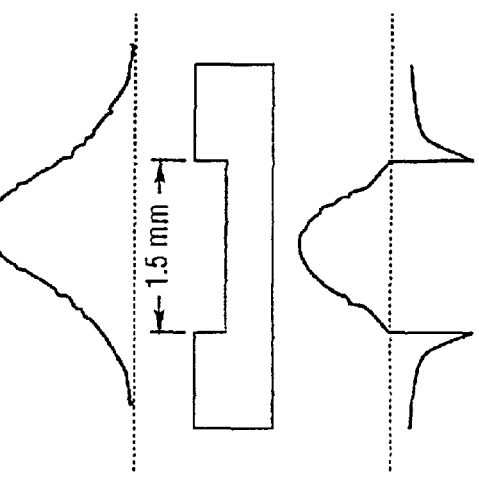
FIG. 20 is a side elevational view of a prior art phase plate with a graph of an input Gaussian pulse thereabove and a graph of a top-hat output pulse therebelow.
Figure 21:
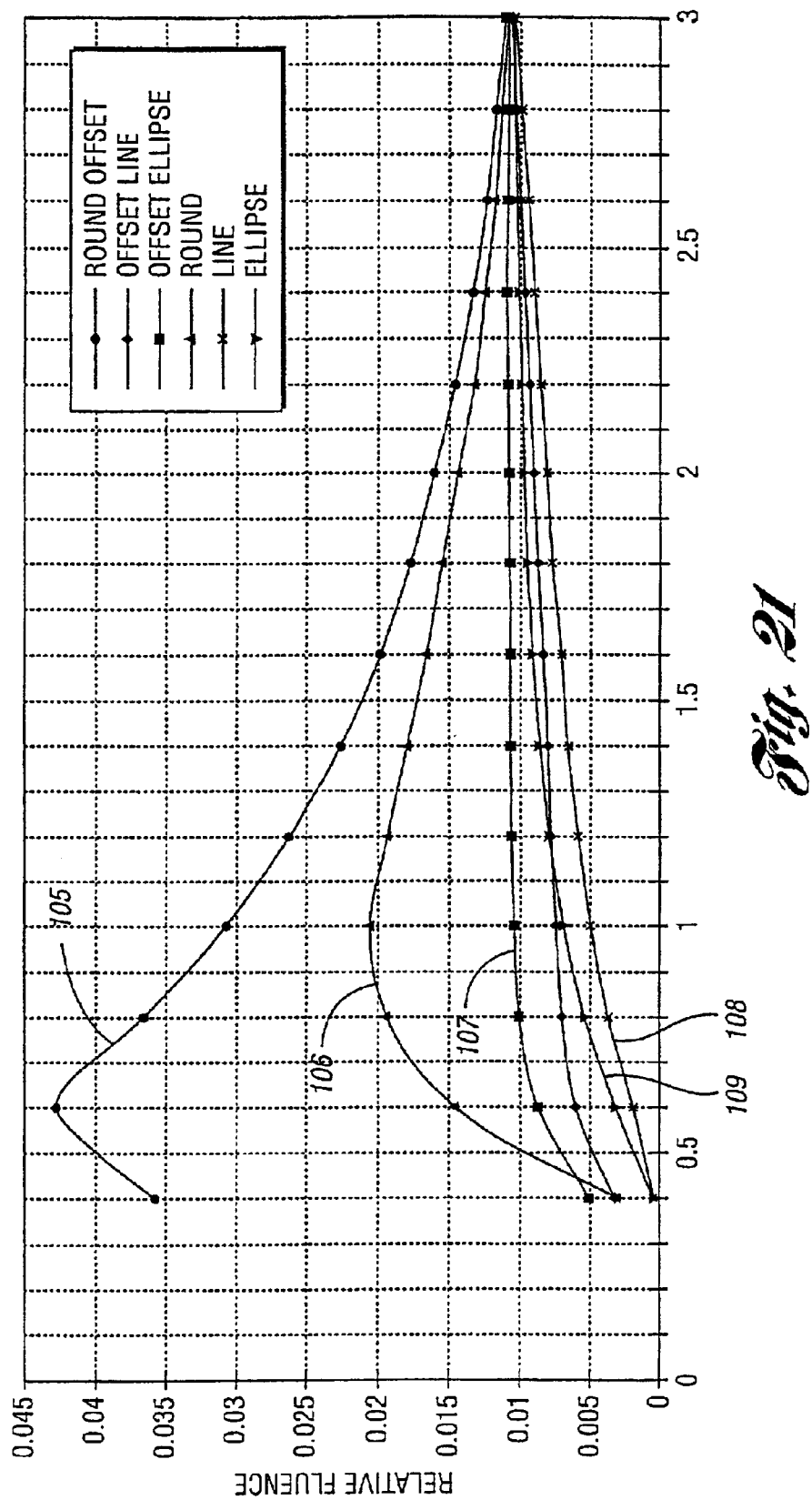
FIG. 21 are a plurality of graphs of relative fluence versus spot half-width in microns which illustrate substrate fluence (energy density on substrate) as a function of misalignment between the link and spot for various spot shapes.

FIG. 21 offers further support for the use of non-round spots for blowing or severing links. When a link and spot are misaligned as shown in FIG. 19d, the incident energy focused on the substrate increases the fluence (energy density, e.g., Joules/cm**2) resulting in possible damage. The effect of a mismatch with round spots (offset at 105 and aligned at 106) is apparent. The risk of damage with an offset ellipse 107 is reduced. The focused line 108 and ellipse 109 both provide low risk of damage.

The controllable elliptical spot can be used for blowing fuses by adapting the aspect of the spot and orienting the axis of the spot in relation to the fuse geometry to maximize absorption and minimize lateral and substrate damage. Fuse geometries with varying orientations are easily and rapidly accommodated with the present invention.

Spatial characteristics of a spot may be chosen or controllably adjusted based on a model of the laser material interactions in the target region. For instance, a thermal model may be used to estimate the amount of material removed and/or the level of collateral damage for a given pulse energy. A computer-based model which includes the thermal diffusion of the laser pulse may be used or modified to correlate the material removed to the spot shape. In link blowing applications where the spot aspect ratio departs from 1:1 with finer pitch such a model based approach to spot shaping may be particularly beneficial. Exemplary spot shapes input to such a model may be elliptical Gaussian, "Top" hat along the length and Gaussian along the width, or other shapes. Trends in DRAM manufacturing are toward increasing density (links/area) and decreasing pitch.

Likewise, in active trimming of devices and electronic circuits control over the "bite size" or kerf width in a specific direction (e.g., parallel to current flow) may be desirable to trim such circuits to a desired value. Likewise, it may be desirable to control the amount of material removed dynamically, based upon comparison with a measured electronic parameter. Similarly, dynamic control over the spot irradiance profile may be advantageous for micromachining holes in materials where the hole geometry must conform to certain shape specifications, including three dimensional specifications.

Figure 12A:
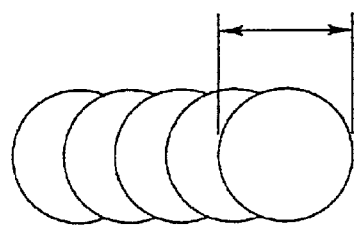
FIGS. 12a and 12b show a sequence of round spots transformed into a corresponding sequence of elliptical spots by use of the method and system of the present invention.
Figure 12B:
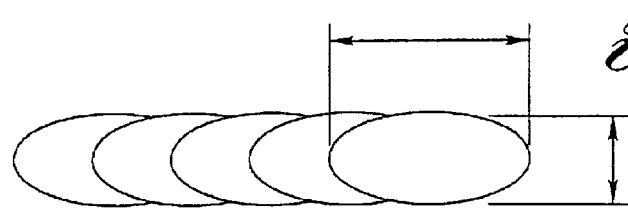

A reduced spot size in the axis across the kerf and an increased spot size in the axis along the direction of cut as shown in FIGS. 12–13 can be used for improved processing speed. Consider an example using a nominal 30-micron spot cutting a line (as shown in FIG. 12a). If the spot is modified to an elliptical spot 20 microns by 45 microns, the area of the spot remains constant, as does the fluence at the workpiece. If the 45 micron axis is oriented along the direction of cutting, with the same pulse rate and bite size compared to the 30 micron spot case, the cutting velocity is increased by 50%. The kerf width is proportionately reduced by 33%. This can readily be seen as an increased line length produced by the five sequential elliptical pulses compared to the round spot case (as shown in FIGS. 12a and 12b).

With a controllable spot orientation, curvilinear and multi-segment lines can be micromachined (as shown in FIGS. 13a and 13b). The orientation of the ellipse in this example can be rotated 90 degrees to create a wide line at a slower scan rate. The speed of trimming U-Cut, L-Cut, and other trim cut shapes may be improved with use of the controlled spot characteristics.

The machining speed may also be improved in applications wherein the spot orientation is fixed in position. FIG. 13c illustrates how the machining speed may be improved while reducing the kerf width in a trimming application wherein a series of parallel kerfs are formed. The benefit increases as a larger number of segments are to be formed with increasing length.

Further, with dynamic control of the spot characteristics, finer control of machining "bite size" may be performed.

Exemplary aspect ratios of about 1.3, 1.5, or somewhat greater are expected to provide significant improvements in machining speed and system throughput.

Certain laser etching applications, where a precise amount of material is to be removed, may benefit from time varying control of the desired set of spot characteristics.

Referring now to FIGS. 24a–24d, the maximum radius of curvature of the ellipse can be set equal to and superimposed upon the local concave radius of a desired target feature, for instance the radius of a drilled hole. A sequence of such spots positioned along a curved path will mesh to form a precise outer radius substantially free of edge scalloping defects, even when a large bit size is used. An efficient hole with high edge quality can be machined with a sequence of precise concentric rings.

In applications where a highly symmetric round beam is desired, an embodiment of the invention may be used to transform certain spot shapes into a more desirable profile. With a round or elliptical input beam, some spot shape irregularities can be attributed to the various effects induced by the optical system. Some of these include aberrations such as astigmatism, cosine errors with deviation of the incident beam from the substrate normal, and vector diffraction effect in very fast polarized optical systems with NA>0.5. An ellipse generating optical system is used to preshape an input beam to compensate for these irregularities so that the spot imaged at the workpiece has substantially desired spatial characteristics.

In accordance with the present invention, the aspect ratio of an incident laser beam may be transformed through a controlled change of orientation and/or aspect ratio. Likewise, the beam amplitude and phase profile may be modified, in conjunction with the orientation control and/or aspect control for instance, to produce a Gaussian or non-Gaussian spot profile such as a "top hat" with a controlled shape having a controlled change in aspect and/or orientation such as an elliptical, rectangular or asymmetric shape.

Several exemplary embodiments follow which provide for beam rotation and transformations of the spot profile. The embodiments may be used alone or in combination and are particularly adapted, though not restricted, for use in automatic systems.

Imaging an elliptical beam is a way to create an elliptical spot shape using Gaussian beam propagation. The wide "fast" axis of the beam will produce a narrow beam waist, while the smaller "slow" axis will produce a larger waist resulting in an elliptical well-focused spot. Two techniques known in the art that are most common for generating an elliptical beam shape are anamorphic beam expansion or compression using either anamorphic prisms or cylindrical beam expanding telescopes. This technique is efficient and does not introduce non-Gaussian artifacts laterally or axially.

Conventional beam shaping and spot shaping techniques generally yield a fixed focal spot aspect ratio. Tilting phase plates or apertures or adjusting anamorphic prism positions can make these devices variable as shown in U.S. Pat. Nos. 5,274,489, 4,059,343, and 6,225,595. Alternatively, in an embodiment of the present invention zooming the cylindrical elements of an anamorphic beam expander or compressor can be used for spot shape adjustment, to the extent that requirements for precision are met for a material processing operation.

In accordance with the present invention, rotation of any of these beam shaping and spot shaping devices can provide variable spot orientation. Alternatively, the device can remain fixed and an image rotator can be used to rotate the beam and align the spot shape to the process feature. Image rotation is classically applied with a rotating Dove prism or an equivalent optical system. The image rotator has the advantage of optical leverage so that the image rotates two times as fast as the rotator device. Thus, for 180 degrees of image rotation, only 90 degrees of mechanical motion is required. Without an image rotator, the rate of image rotation is typically equal to the device rotation, so a 180 degree rotation requires 180 degrees of mechanical motion. Typically, image rotation also results in polarization rotation. This polarization rotation may cause variable transmission loss which may be undesirable for material processing. Also, rotation of elements in an optical system that deviate the beam axis can cause undesirable beam clipping as well as position errors of the spot at the workpiece.

Figure 7:
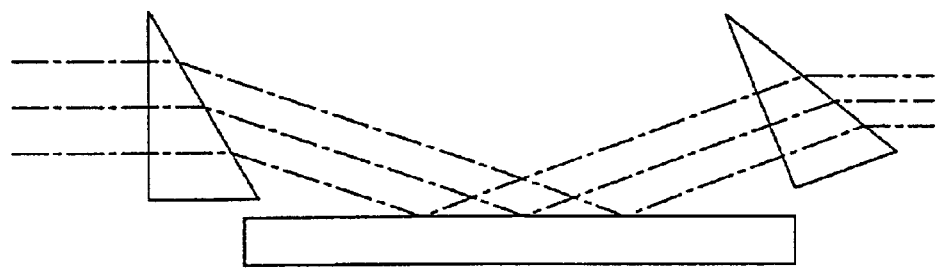
FIG. 7 is a side elevational schematic view of a pair of prism pairs of U.S. Pat. No. 4,580,879.
Figure 8:
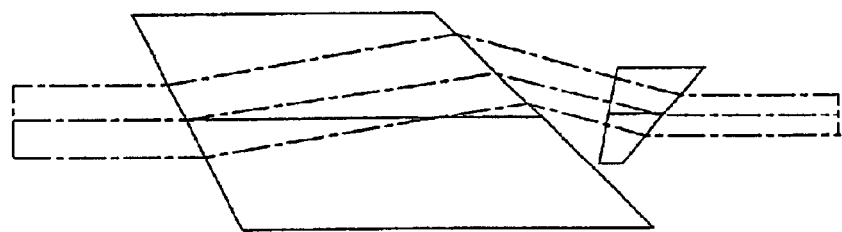
FIG. 8 is a side elevational schematic view of a pair of prism pairs of U.S. Pat. No. 6,219,169.
Figure 9:
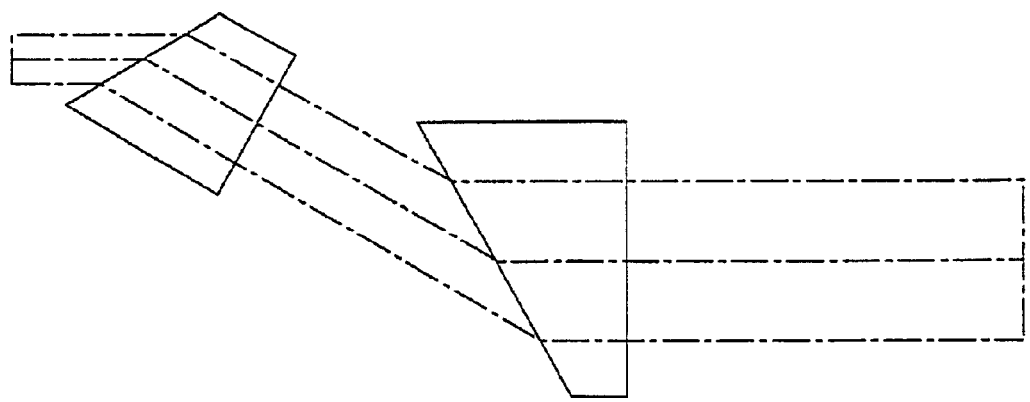
FIG. 9 is a side elevational schematic view of a pair of prism pairs of U.S. Pat. No. 4,948,233.

A variable beam compensating optical system using a pair of non-offset anamorphic beam expanders is disclosed in U.S. Pat. No. 6,219,169. Independently rotating two expanders provides magnitude adjustment and alignment of the compensation with the input beam. A two-prism refractive non-deviating prism arrangement is shown in U.S. Pat. No. 4,948,233 (i.e., FIG. 8 hereof). Other types of non-deviating arrangements are disclosed. U.S. Pat. No. 4,623,255 shows a single piece arrangement. U.S. Pat. No. 4,128,308 shows a complex arrangement including TIR surfaces. U.S. Pat. No. 4,580,879 shows a device including a fold mirror (i.e., FIG. 7 hereof) and U.S. Pat. No. 4,627,690 shows a dual TIR parallel output prism pair.

An astigmatic Gaussian beam can be used to create elliptical spots as is U.S. Pat. No. 5,632,083. The astigmatic beam has two beam waists; separated in the z-axis. At each waist, the beam is elliptical with the waist representing the minor axis. The ellipses of each waist are oriented orthogonally. Changing the focus of an astigmatic beam will change the aspect ratio of the spot. The astigmatic beam is widely used for focus detection.

A beam-compensating optical system is disclosed in U.S. Pat. No. 6,219,169 with embodiments that detail the use of a pair of anamorphic beam expanders for compensation purposes. While this system is proposed to modify the shape of an elliptical beam into a circular beam, this type system is applicable in an embodiment of the present invention to control spatial characteristics of an input beam.

In a preferred embodiment of the invention, an adjustable aspect can be implemented between 1 and $M^2$ by continuously varying the relative orientation of the two beam expanders. Cascading two anamorphic beam expanders and rotating them independently creates a controlled spot with a variable aspect ratio and rotation. The relative orientation of the expanders provides the aspect ratio and the absolute orientation of the pair determines the orientation of the spot axis. If the expansion M of the two expanders is equal and the expansion axes are crossed at 90 degrees, then a symmetric expansion and a round beam with expansion M is achieved. If the expansion axes coincide, then an expansion $M^2$ is along only one axis and the aspect ratio of the beam is modified by a factor of $M^2$.

It is preferred that beam deviation be controlled so that device rotation does not cause spot position errors or beam clipping. Two element cylindrical beam expanders and anamorphic prisms as described in U.S. Pat. No. 6,219,169 and shown in FIG. 8 have no capability to correct the wedge element errors in the non-expanding axis that will cause beam steering. High accuracy elements are therefore preferred for precision applications. Desensitized and/or adjustable compensated devices can also facilitate higher precision. Those skilled in the art of optical design and computer modeling will be able to assess the precision requirements for specific requirement of spot placement.

Beam expanders with one reflective surface can provide beam steering capability to facilitate alignment by mechanical adjustment. For tilt desensitization, a second reflective surface can be provided to minimize beam steering effects.

When the maximum expansion is chosen to be greater than required, the range of motion of the beam expanders can be substantially reduced. Reducing the rotation of the beam expanders reduces the pointing error contributions due to beam steering in the beam expanders. Reducing the rotation angle also reduces possible polarization sensitivity. For example, with anamorphic prisms used near Brewster's angle, for anti-reflection, large rotations frustrate the Brewster's angle criterion resulting in large polarization dependent reflection losses. With small rotations in the 10–20 degree range, reflection loss variations are limited to a few percent. For designs where the polarization-sensitive axes of the expanders are not aligned, a polarization rotating element such as a half-wave plate can be used between the beam expanders to improve efficiency.

Figure 11:
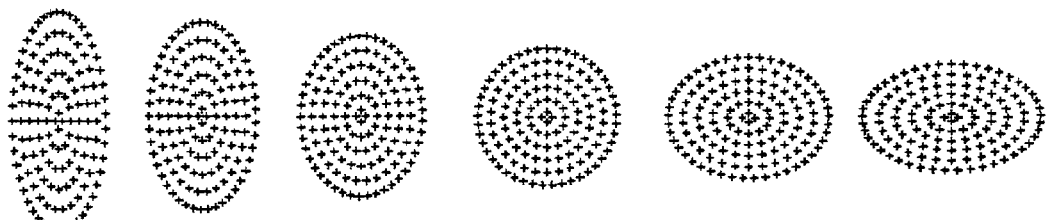
FIG. 11 shows beam irradiance profile with near orthogonal ellipse axes with rotation of a second expander of the present invention through a crossed null position.

When high expansion beam expanders are rotated from an ellipse beam shape through the round shape back to an ellipse shape, the second ellipse axis is approximately orthogonal to the first ellipse shape, as shown in FIG. 11. This provides for orienting the ellipse orthogonally without the need for large angular rotations of the beam expanders. Small non-linearities in the ellipse orientation can be controlled with small corrective beam expander rotations. When the beam is generated with a beam shaping filter, optical compensation may be used to correct orientation non-linearities and reduce potential beam distortion. Conveniently, with high expansion beam expanders, arbitrary ellipse orientations can be achieved with only less than 180 degrees of beam rotation. For example, 90 degree rotation may be used.

An image rotator may be used in conjunction with a fixed anamorphic beam expander. With this embodiment, the beam expander may then be an offset and deviating type such as a single transmissive wedge prism or prism with TIR as in U.S. Pat. No. 4,759,616. For a variable expansion system with a second polarization-sensitive anamorphic beam expander, the image rotator might cause transmission variation. It is known that a rotating half-wave plate is useful as a polarization rotator. A wave plate at 45 degrees is used as a 90 degree polarization rotator, but a wave plate at say 30 degrees will rotate the polarization 60 degrees. The polarization rotation $\theta_b$ is twice the rotation of the wave plate $\theta_r$. A half-wave plate can be mounted after the image rotator with the optical axis of the plate aligned to the input polarization axis of the rotator so as to rotate $\theta_r$ with the image rotator. The rotated polarization incident on the wave plate $\theta_b$ is twice the rotation of the wave plate $\theta_r$ so the wave plate will counter rotate the polarization back to the input orientation. This polarization preserving image rotator or an equivalent can be used in conjunction with various configurations of anamorphic prisms.

Many beam expander magnification combinations are possible that may have equal or differing magnifications. For example, a pair of beam compressors or an expander and a compressor could be used. In total, there are four possible permutations of optics, expander/expander, expander/condenser, condenser/expander, and condenser/condenser. An anamorphic beam expander with expansion M and a beam compressor with compression 1/M could be used. In this case, a magnification of 1 is achieved when the expansion and compression axes are aligned and an aspect ratio of $M^2$ is achieved when the axes are crossed. The combination of condenser=>expander provides a smaller beam footprint than the expander=>condenser. This eases the fabrication requirements and provides for small optics.

In yet another embodiment of the invention, a pair of adaptive optical devices such as deformable mirrors may be used to vary beam aspect. Each device is configured to create a cylindrical element. The relative optical power of the elements determines the anamorphic expansion. Adaptive optical devices may vary the orientation of their cylinder axes to determine the orientation of the expansion axis.

When cylindrical devices are used, it is possible to interleave the optical elements of the two devices to provide a more compact optical system. Consider devices A and B with elements A1, A2, and B1, B2, respectively, the sequence along the optical axis would be A1, A2, B1, and B2. An interleaved approach would use a sequence A1, B1, A2, B2. A nested approach is also possible to create a compact system. In this case, the sequence of elements would be A1, B1, B2, A2. In all cases the device elements A1 and A2 maintain their relative rotation orientation to each other as do elements B1 and B2.

Those skilled in the art of laser processing will be aware that some form of relative motion is generally used to position the target and laser beam. In many micromachining systems combinations of translation stages and/or rotating mirrors, for instance galvanometers ("galvos"), are used. The controllable spatial characteristic of the present invention can be applied with such combinations of positioning devices. As shown in FIG. 13, the ellipse rotation speed requirements are limited during curve following with gradual rotation. Generally, the most demanding requirement is when sharp corners are turned. Typically, this coincides with the highest demand on the stage or galvo.

When this invention is used with $TEM_{00}$ Gaussian beams, variable aspect elliptical spots with Gaussian profile result. The embodiments may also include a filter element to modify the amplitude and/or phase distribution of the beam in the generating step and thereby further modify the spot shape and irradiance profile. For example, a filter such as Cordingley's phase plate is used to create a beam profile that will result in a top-hat spot shape. When this filter is included in the step of generating the beam, the shaping applied to the beam will shape the filter imprint along with the beam aspect. Thus, the aspect and orientation of the filtered spot shape are variable. The normally round top hat will be converted to a controllable elliptical top hat spot.

Figure 16:
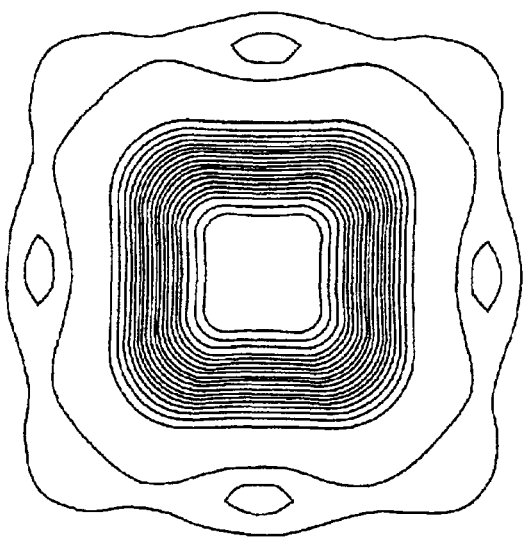
FIG. 16 is a plot of a square spot.
Figure 17:
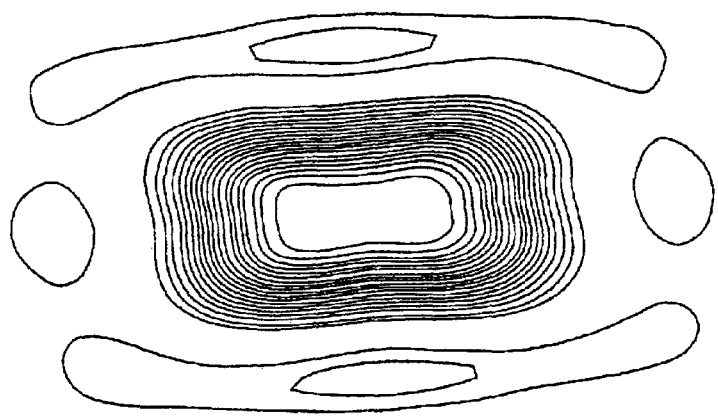
FIG. 17 is a plot of a rectangular spot made from a modified square spot with non-linear rotation and asymmetry.
Figure 18:
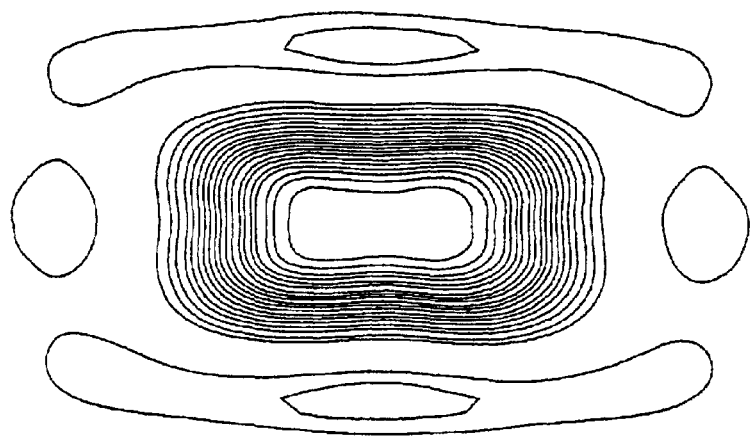
FIG. 18 is a plot of an improved rectangular spot from a modified square spot showing spot shaping with optical compensation using a third embodiment of an expander.

Rotationally symmetric filters are used to create symmetric spots like the round top hat shape. Other filters may be used that are not rotationally symmetric for creating nominally non-rotationally symmetric spots. Filters with 4-fold symmetry may be used with null expansion to create a variable spot along substantially orthogonal axes. For example, a filter producing a square spot shape (i.e., FIG. 16) can produce variable rectangular spots aligned with the filter orientation as shown in FIGS. 17 and 18. Gaussian beam shaping is discussed theoretically in chapter 3 of "Laser Beam Shaping: Theory and Techniques," edited by Fred M. Dickey, Scott C. Holswade, New York: Marcel Dekker, 2000.

In the case of a rectilinear beam transform filter, correction of rotation non-linearity is preferred to maintain the orthogonality of the shaped spot to the target through a variable range, and image rotation is preferred for intermediate, non-orthogonal spot orientations.

Those skilled in the art will recognize that other non-aligned orientations are possible. For example, the square spot may be changed to a variable diamond shape. Of course, other symmetric and asymmetric filters may be used to create spots with controllable spatial characteristics. Various alternatives are known to those skilled in the art of optical filtering as taught in U.S. Pat. No. 5,300,756 (Cordingley); U.S. Pat. No. 5,864,430 (Dickey) and U.S. Pat. No. 5,917,845 (Sales et al.).

Many types of rotary actuators such as stepper motors and servos can be used in an embodiment of the invention for dynamic control of the beam expanders' orientations and hence dynamic control of the laser spot aspect size and orientation. When high-speed operation is desired, the rotational inertia of the optics may be reduced and closed loop servo-controlled actuators may be used. The anamorphic beam expansion is preferably applied at a point in the optical beam path where the beam diameter is relatively small. The use of a condenser/expander layout also helps to reduce the optics inertia. Improvements in the field of image rotation, particularly high-speed actuators and (zero inertia) solid state devices are expected to provide direct benefit to this invention.

A propagating beam is incident on a first anamorphic beam expander, a second anamorphic beam expander and a scanning system including an objective lens. The first beam expander adapts the irradiance pattern of the beam to a first ellipse of a predetermined aspect ratio. A first beam rotating means controls the orientation of the first elliptical beam irradiance pattern. The first elliptical beam is incident on a second anamorphic beam expander with the ellipse axis oriented at a predetermined orientation to the second anamorphic beam expander. The second anamorphic beam expander adapts the first elliptical beam irradiance pattern to a second elliptical irradiance pattern. A second beam rotator controls the orientation of the second elliptical beam.

Preferably, the first and second anamorphic beam expanders are identical optical devices. Preferably, rotation of the first anamorphic beam expander relative to the second anamorphic beam expander comprises the first beam rotator, and rotation of both anamorphic beam expanders comprises the second beam rotator. One skilled in the art will recognize that one or two discrete image rotors could be used in lieu of rotating either or both of the anamorphic beam expanders.

Preferably, the expansion of each anamorphic device is greater than $M^{0.5}$ where M is the desired anamorphic expansion.

Figure 1:
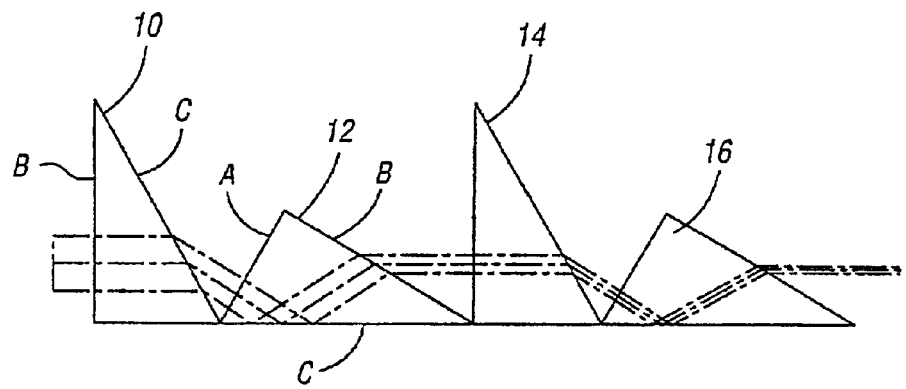
FIG. 1 is a side elevational schematic view illustrating two pairs of 30–60-90 prism anamorphic beam expanders of the present invention and a laser beam passing therethrough.
Figure 2:
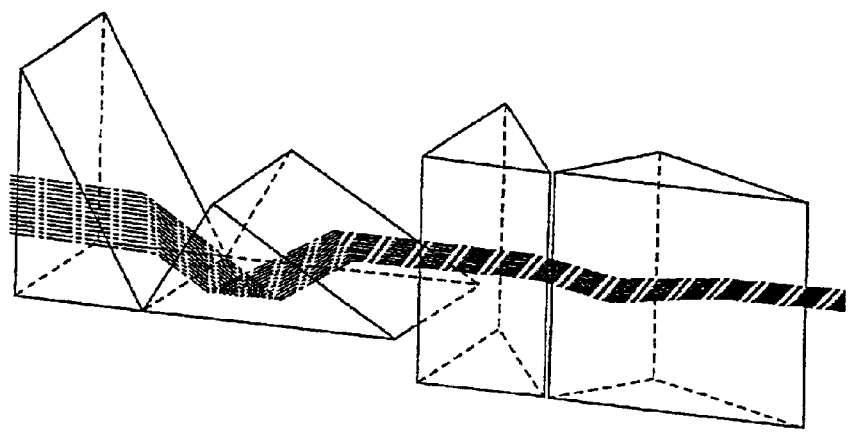
FIG. 2 is a perspective schematic view of two pairs of non-offsetting expanders and laser beam passing therethrough.
Figure 3:
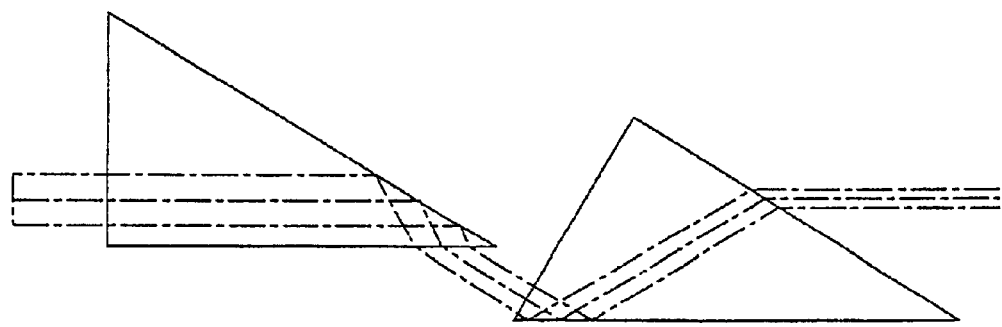
FIG. 3 is a side elevational schematic view of a pair of non-offsetting prisms and a laser beam passing therethrough.
Figure 4:
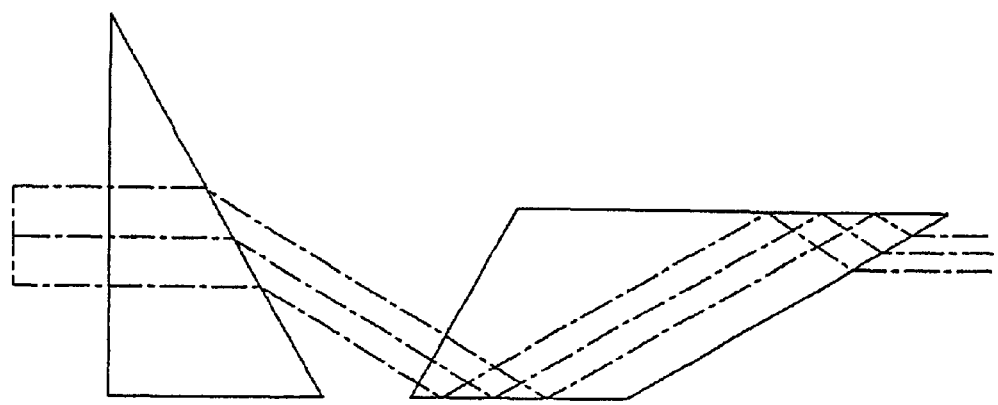
FIG. 4 is a side elevational schematic view of another pair of non-offsetting prisms and a laser beam passing therethrough.
Figure 5:
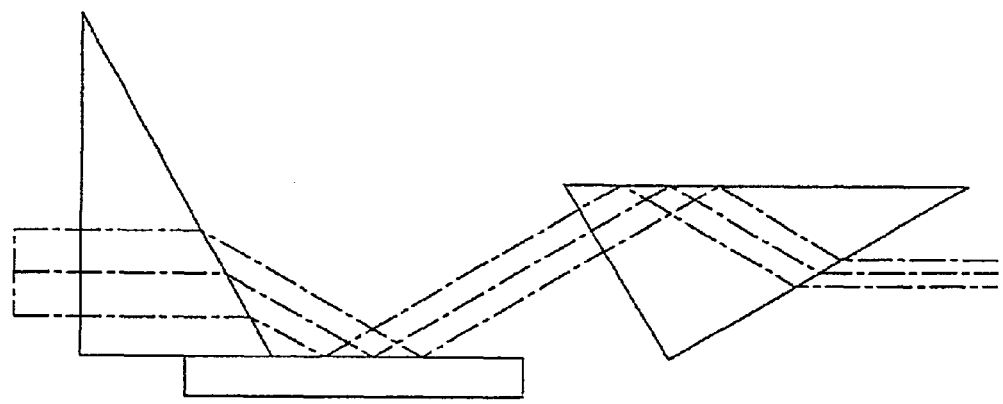
FIG. 5 is a side elevational schematic view of non-steering prism pairs and a laser beam passing therethrough.
Figure 6:
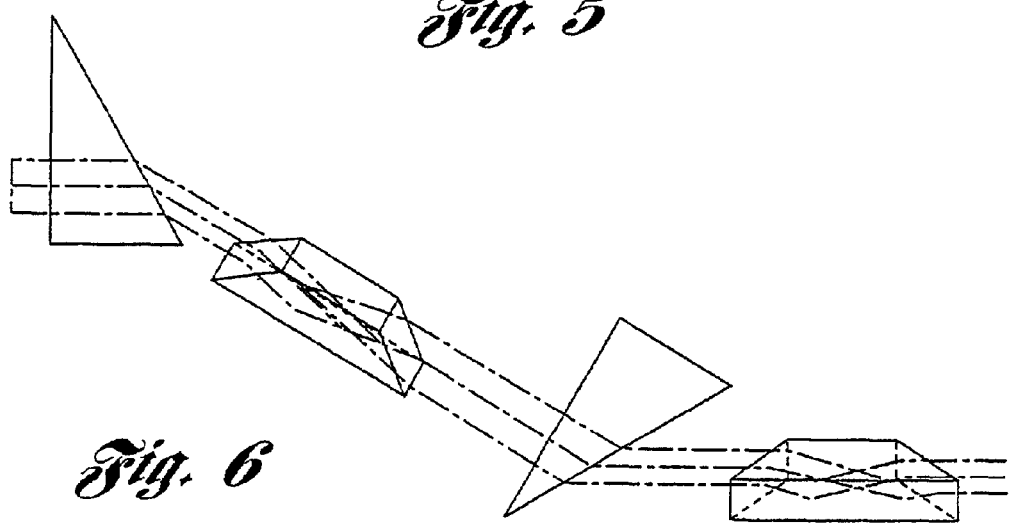
FIG. 6 is a side schematic view of an anamorphic prism pair with Dove prism rotators.

In one embodiment, each beam expander is comprised of a pair of 30–60–90 degree prisms 10 and 12 and 14 and 16 made from SF14 glass as shown in FIG. 1. Prism faces A, B and C oppose angles 30, 60 and 90, respectively. Each beam expander operates in the following way. The first prism is used as a 30-degree wedge to refract the beam. The first surface B is normal to the input beam and anti-reflection coated. The second surface C is near the Brewster's angle to reduce reflection losses. The refracted beam is deviated at an angle from the optical axis of approximately 60 degrees. The second prism is oriented so that the hypotenuse C is parallel to the input beam axis and the face A is normal to the beam deviated from the first prism. The beam transmits through the AR coated face A and is incident on the hypotenuse C at approximately 60 degrees. The incident angle is sufficient to produce TIR reflection. The beam in deviation is now reversed upon reflection. The beam now propagates to face B of the second prism and is incident at approximately 30 degrees near Brewster's angle. The relative positions of the prisms are set so that the beam intercepts face B substantially at the height of the input optical axis. Upon refraction from face B at a point on the optical axis the beam is deviated so as to propagate along the optical axis without angular or lateral deviation.

Each beam expander is rotatably mounted. The expansion axis of the second expander is orthogonal to the first so that the normal circular beam is expanded at a magnification of about 3. The axes of both expanders are normally at 45 degrees to the desired ellipse orientation. Rotation of the second beam expander in clockwise and counterclockwise directions produces nearly orthogonal variable elliptical beams. Fine rotation adjustment of both beam expanders through a small error-correcting angle orients the ellipse to high precision. With a linearly polarized beam, the polarization is aligned with quarter wave plates into each beam expander, and aligned relative to the ellipse axis upon exiting the second beam expander. The elliptical beam is imaged through an objective to a target to produce variable elliptical spots as a result of Gaussian beam propagation.

Figure 10A:
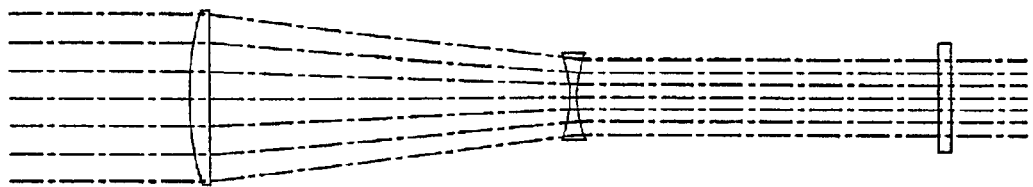
FIGS. 10a and 10b are top and side schematic views, respectively, of a three-element, sphero-cylindrical beam expander with crossed cylinders for alignment compensation.
Figure 10B:
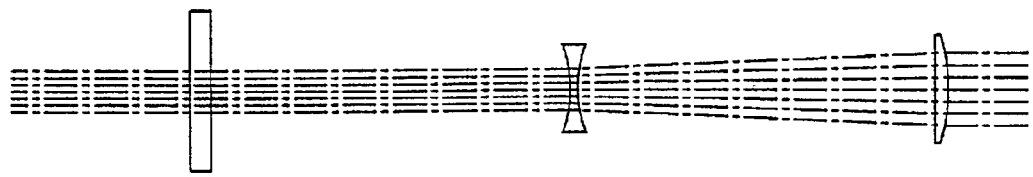

Another related embodiment uses cylindrical beam expanding optics as shown in FIGS. 10a and 10b. Each beam expander is comprised of two cylindrical and one spherical lens. The axes of the two cylindrical elements are orthogonal and are arranged about the spherical element to create two orthogonal expansions. Translation of elements allows wedge deviations to be nulled in two planes. Sensitivity to input collimation is less than that of the prism design and astigmatism correction is possible with axial element adjustments.

FIG. 14 shows a system of the present invention including a laser source, a system controller and a laser beam delivery and focusing subsystem in the form of an X,Y scan system. An ellipse generator/rotator (i.e., EGR) includes an elliptical beam generator, a beam rotator and interface electronics and drivers. The generator typically takes a round beam profile of the output of laser source and generates a prescribed elliptical beam cross-section. The beam rotator may maintain the elliptic axis along the direction of cut. In this embodiment, the interface/drivers includes a digital system interface, a power interface and drivers for the generator and rotator.

The system controller generates control signals which control not only the laser source and the X,Y scan system but also the generator and the rotator based on reference data which represent target characteristics such as the predetermined locations and orientations of the target material.

In another embodiment of the present invention, a plurality of optical paths are provided with an optical switch to switch between the optical paths. Each optical path contains a unique set of optical elements. For example, each one of two paths includes anamorphic optics to control the spot aspect and align the spot axis orientation. The beams of the two optical paths are oriented so that the major axis of each spot is aligned to an orthogonal target feature. A multi-path, polarization-based optical switch, such as that disclosed in U.S. Pat. No. 3,753,608 (for focusing), provides fast switching between the orthogonal spot states. When orthogonal switching between two or more fixed states, each path includes fixed anamorphic expansion, however, variable aspect ratio spots with arbitrary orientations can be achieved with anamorphic optics disclosed in the present invention.

Figure 22:
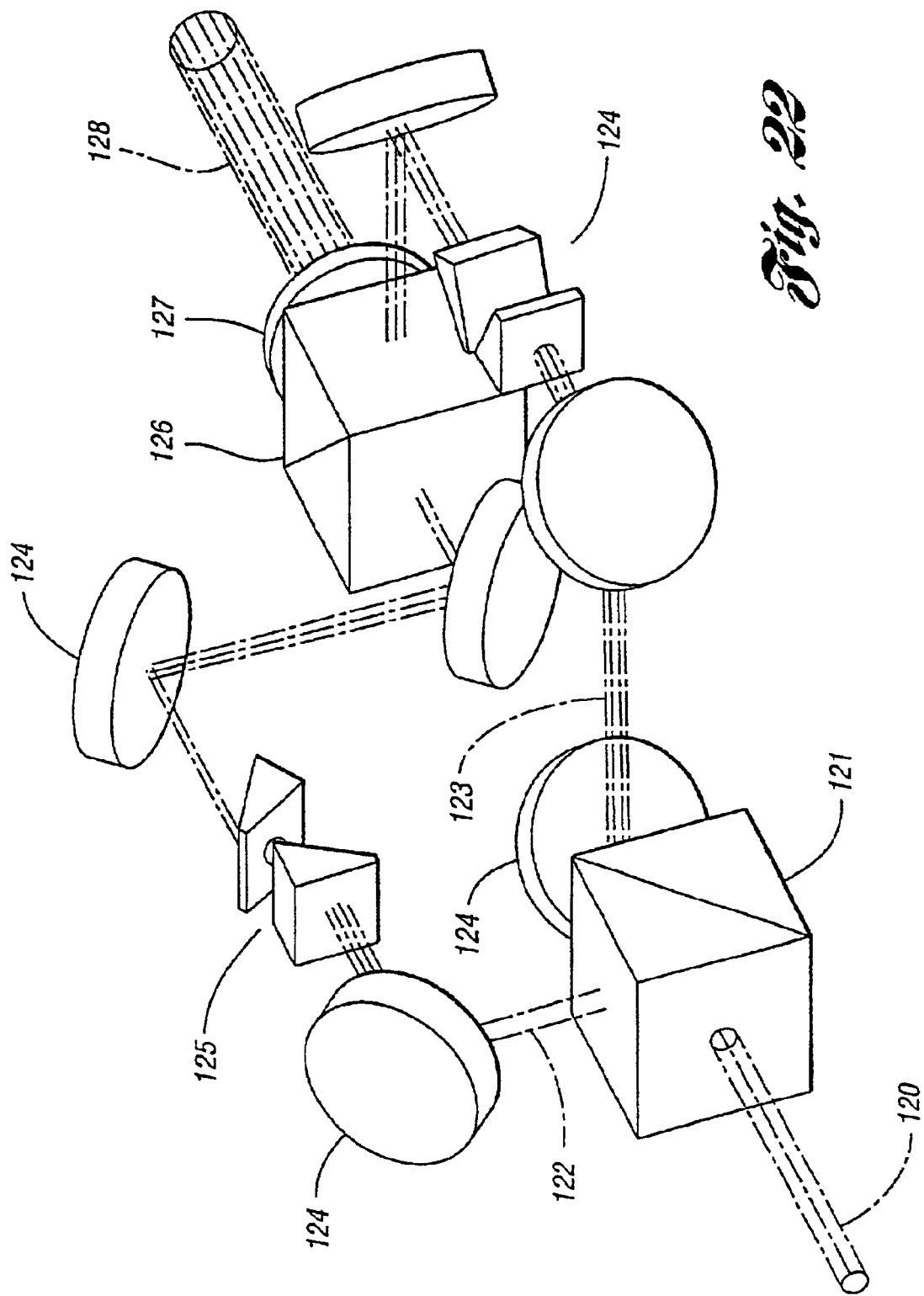
FIG. 22 is a schematic view of a switched system of the present invention wherein two different optical paths are provided for a laser beam.

FIG. 22 illustrates one such embodiment. A polarized input beam 120 may be the output of a polarization rotator, for instance, a computer-controlled liquid crystal device. U.S. Pat. No. 6,181,728, assigned to the assignee of the present invention and hereby incorporated by reference in its entirety, describes a polarization controller and use of oriented polarized beams for processing structures. The input polarization may be one of two orthogonal polarizations, for instance. The beam splitter 121 will pass the beam along the two optical paths 122,123, as shown. Each path includes various folding mirrors 124 and anamorphic optical elements 125 to change the beam aspect ratio and orientation. The beam is then redirected to the polarization beam splitter "combiner" 126 which is used to return the beam to the original path. A second polarization rotator 127 may then be used to select the output polarization for the beam 128 which is then delivered to a focusing sub-system and focused onto the object. Alternatively, the output polarizing element(s) 127 may be a waveplate used to convert to a circular polarization or optical elements to create an unpolarized delivery beam. Those skilled in the art will recognize that variations of this embodiment may also be used, and various components may be added to the sub-system to facilitate alignment and to provide long term pointing stability.

The switching may be between paths that impart different amounts of beam rotation. In this configuration, the polarization axis of at least one optical path may become misaligned with the anamorphic beam axis. One or more quarter wave plates are used to realign the polarization axis with the beam for particular beam paths. U.S. Pat. No. 4,318,591 discloses an orthogonal polarization switched image rotator that maintains the polarization axis relative to an elliptical spot axis.

Two or more switched paths may be used in a serial fashion where a first plurality of beam paths is provided to control one spot feature and a second plurality of beam paths follows the first to control a second feature. For example, a first polarization beam switch switches between two paths with different amounts of anamorphic beam expansion, say 2× and 3× aspect ratios. The 2× or 3× aspect beam is switched by a second polarization beam switch to control the orthogonal orientation.

A target characteristic may include an orientation, dimension (i.e., length, width, thickness), and a measured characteristic like measured resistance. The characteristic may be predetermined or measured during the laser processing operation and monitored via process feedback.

FIG. 15 is similar to FIG. 14 except devices 1 and 2 represent the previously described preferred embodiment of the present invention wherein the drivers drive the actuators for rotating the anamorphic devices.

The invention is applicable to both CW and pulsed laser processing operations. The present invention may also be applied with femtosecond laser processing systems wherein a precisely controlled ablation threshold allows for selective material removal, or in similar narrow pulse systems in the picosecond range. In such applications, consideration is to be given to the dispersion of the optical elements when selecting optical components.

In practice, the modified spot is positioned at various points along the target. In one embodiment, high-speed, sequential positioning of the spot within the field can be accomplished by relatively positioning the laser beam and target with a low inertia beam positioning system. For example, a solid-state beam deflector or galvanometric scanning system may be used and are know to those skilled in the art of laser processing as illustrated in U.S. Pat. No. 5,998,759 and U.S. Pat. Nos. 4,532,402 and 5,837,962 to Overbeck.

The use of galvanometers and/or acousto-optic deflectors for vector and random access scanning are well known. Other embodiments might include micro-mirrors, light-weight diffractive optical elements or moving lens along one or more axes. Similarly, a combination may be chosen for multi-axis scanning.

U.S. Pat. No. 5,998,759, assigned to the assignee of the present invention, also teaches the use of an external modulator for providing laser pulses on demand, each of which are correlated to the position of a target, under computer control. This approach generally allows for possibilities from a series of overlapping spots forming a line (such as a laser kerf) to an arbitrary pattern within the field (such a series of selected microscopic target structures in a row or column or a specified code for marking).

In another embodiment, relatively positioning of the modified laser beam and target may be performed by using a combination of coarse motion of laser processing equipment and precision translation stage motion as shown in U.S. Pat. No. 6,144,118, where the fine stage supports a semiconductor wafer. This may be used in combination with the "pulse on demand" approach described in the '759 patent for removing links or processing other microscopic structures.

Various combinations may be utilized. U.S. Pat. Nos. 5,847,960 and 5,751,585 describe various embodiments for relatively positioning laser beams using a combination of high-speed beam positioners, for instance galvanometers, and slow translation stages.

Figure 23:
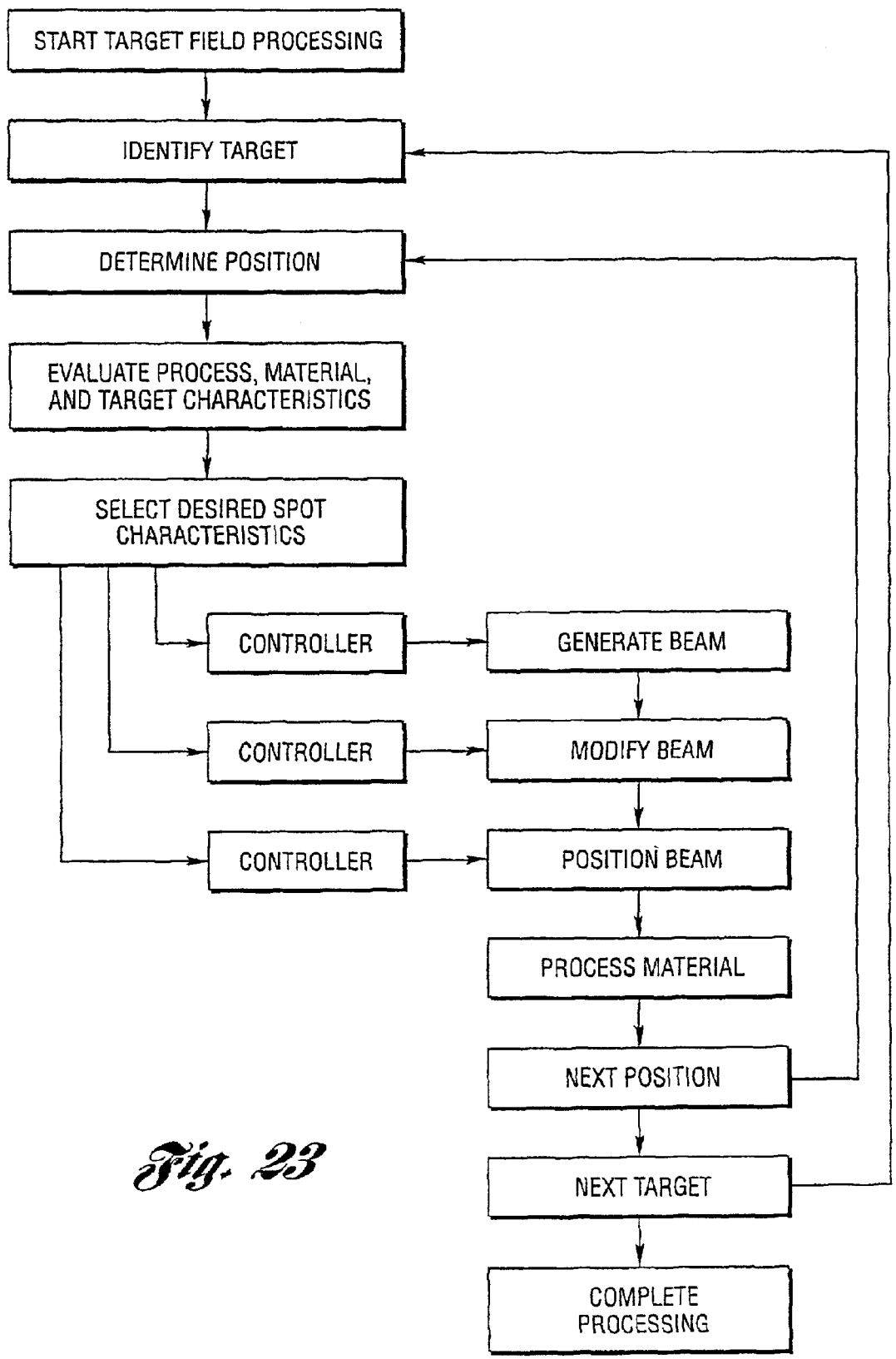
FIG. 23 is a block diagram flow chart illustrating the method of the present invention.
Figure 24A:
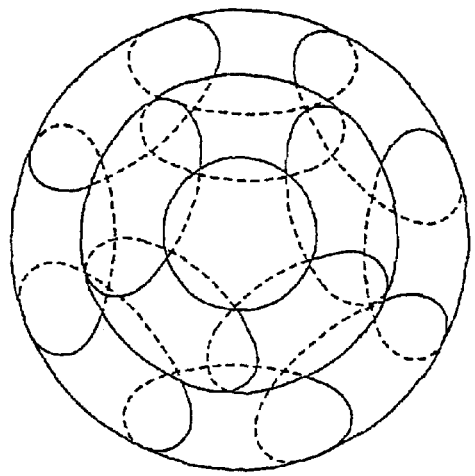
Figure 24B:
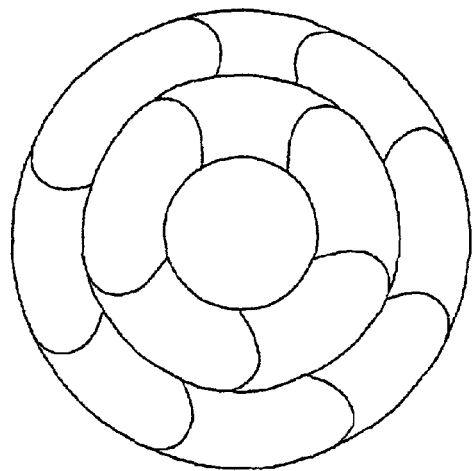
Figure 24C:
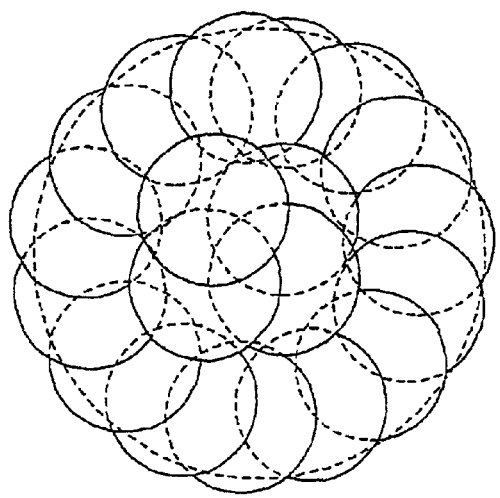
Figure 24B:
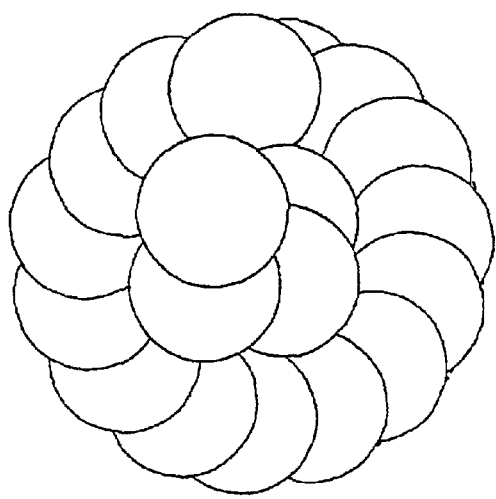

FIG. 23 provides, in block diagram flow chart form, a summary of the various process steps used by a method of the present invention.

These techniques, used alone or in combination, are applicable to micro-machining applications including laser drilling, trimming, semiconductor link blowing, mask repair, among others.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A high-speed, precision, laser-based method for processing material of at least one target within a field, the method comprising:
   generating a laser beam along a propagation path;
   controllably modifying the laser beam to obtain a modified laser beam; and
   sequentially and relatively positioning the modified laser beam into at least one well-focused spot at each target within the field to process the material of each target wherein the at least one spot has a set of desired spatial characteristics including an adjustable aspect ratio which are obtained by the step of controllably modifying.

2. The method as claimed in claim 1, wherein the at least one well-focused spot has a pair of axes and wherein the modified laser beam is focused to a substantially common point in both axes.

3. The method as claimed in claim 1, wherein the adjustable aspect ratio is greater than 0.1 but less than 10.

4. The method as claimed in claim 3, wherein the adjustable aspect ratio is greater than 0.33 but less than 3.

5. The method as claimed in claim 1, wherein the step of sequentially and relatively positioning includes the step of vector scanning the modified laser beam.

6. The method as claimed in claim 1, wherein the step of controllably modifying the laser beam is repeated during the step of sequentially and relatively positioning the modified laser beam so that the at least one well-focused spot has at least a second set of desired spatial characteristics.

7. The method as claimed in claim 1, wherein the set of desired spatial characteristics is determined based on at least one target characteristic of each target.

8. The method as claimed in claim 1, wherein the set of desired spatial characteristics is determined based on at least one target material property of each target.

9. The method as claimed in claim 1, wherein the set of desired spatial characteristics is determined based on at least one process variable.

10. The method as claimed in claim 1, wherein the set of desired spatial characteristics is determined based on at least one desired laser material processing characteristic.

11. The method as claimed in claim 1 wherein the step of generating includes the step of shaping the laser beam to change the aspect ratio and to obtain a modified beam having a first elongated irradiance pattern with a first orientation wherein the modified beam is delivered and focused into the at least one well-focused spot.

12. The method as claimed in claim 11, wherein the step of generating includes the step of further shaping the modified beam to obtain a laser beam having a second elongated irradiance pattern with a second orientation.

13. The method as claimed in claim 12, wherein the step of controllably modifying controls absolute orientation of the first and second orientations based on target orientation.

14. The method as claimed in claim 12, wherein the step of shaping further includes the step of controlling relative orientation of the first and second orientations.

15. The method as claimed in claim 1, wherein the step of sequentially and relatively positioning delivers and focuses the beam into a plurality of well-focused spots extending along a laser processing path wherein the aspect ratio and orientation of each of the spots is based on predetermined dimensions of each target and target orientation.

16. The method as claimed in claim 15, wherein the laser processing path is a curvilinear path.

17. The method as claimed in claim 15, wherein each of the well-focused spots is an elongated spot having a major axis and wherein the major axis of at least one of the spots is aligned with the laser processing path.

18. The method as claimed in claim 15, wherein each of the well-focused spots is an elongated spot having a major axis and wherein the major axis of at least one of the spots is transverse the laser processing path.

19. The method as claimed in claim 1, wherein an aspect ratio and orientation of the at least one spot are controlled based on predetermined dimensions of each target and target orientation.

20. The method as claimed in claim 1, wherein the step of generating includes the step of filtering the laser beam to obtain an initially modified spot shape.

21. The method as claimed in claim 1, wherein the step of generating includes the step of filtering the laser beam to obtain an initially modified spot irradiance profile.

22. The method as claimed in claim 1, wherein the processing is micromachining.

23. The method as claimed in claim 1, wherein the processing includes semiconductor link removal, laser trimming, laser drilling or laser etching.

24. The method as claimed in claim 1, wherein the step of sequentially and relatively positioning delivers and focuses the modified beam into a well-focused spot which is scanned along a laser processing path wherein an aspect ratio and orientation of the spot is based on predetermined dimensions of each target and target orientation.

25. The method as claimed in claim 1, wherein the modified beam has an irradiance pattern of an elliptical Gaussian beam.

26. The method as claimed in claim 1, wherein the modified beam has an irradiance pattern of a top hat in one direction and Gaussian in a direction orthogonal to the one direction.

27. The method as claimed in claim 1, wherein multiple targets are within the field.

28. A high-speed, precision, laser-based method for processing material of at least one target within a field, the method comprising:

a) generating a laser beam along a propagation path;

b) controllably modifying the laser beam to obtain a modified laser beam;

c) relatively positioning the modified laser beam into at least one well-focused spot at a target within the field to process the material of the target wherein the at least one well-focused spot has a set of desired spatial characteristics including an adjustable aspect ratio which are obtained by step b); and d) repeating steps a) through c) for each target until the material of all targets within the field are processed.

29. The method as claimed in claim 28 further comprising: e) evaluating at least one of process, material and target characteristics to obtain data wherein step b) is based on the data.

30. The method as claimed in claim 29, wherein step d) repeats steps a) through c) and step e) for each target until the material of all targets within the field are processed.

31. A high-speed, precision system for processing material of at least one target having predetermined dimensions and a characteristic within a field, the system comprising:

a laser source for generating a laser beam along a propagation path and having an irradiance pattern with an aspect ratio and an orientation in a plane substantially perpendicular to the propagation path;

a controller for generating control signals including orientation control signals based on the characteristic;

a first subsystem disposed in the propagation path for shaping the laser beam based on the predetermined dimensions to change the aspect ratio and obtain a modified beam;

a second subsystem for controllably changing the orientation of the irradiance pattern based on the orientation control signals; and a beam delivery and focusing subsystem for sequentially positioning and focusing the modified beam into at least one well-focused spot on each target to process the material of each target.

32. The system as claimed in claim 31, wherein the beam delivery and focusing subsystem sequentially positions and focuses the modified beam to a plurality of well-focused spots extending along a laser processing path wherein the aspect ratio and the orientation of each of the spots is based on the predetermined dimensions and target orientation.

33. The system as claimed in claim 32, wherein the laser processing path is a curvilinear path.

34. The system as claimed in claim 32, wherein each of the well-focused spots is an elongated spot having a major axis and wherein the major axis of at least one of the spots is aligned with the laser processing path.

35. The system as claimed in claim 32, wherein each of the well-focused spots is an elongated spot having a major axis and wherein the major axis of at least one of the well-focused spots is transverse the laser processing path.

36. The system as claimed in claim 31, wherein the first subsystem includes an ellipse generator and wherein the irradiance pattern of the modified beam is an elliptical irradiance pattern and the at least one well-focused spot is at least one well-focused elliptical spot.

37. The system as claimed in claim 36, wherein the second subsystem includes a beam rotator for rotating the modified beam.

38. The system as claimed in claim 31, wherein an aspect ratio and orientation of the at least one well-focused spot are controlled based on the predetermined dimensions and target orientation.

39. The system as claimed in claim 31, wherein the processing is micromachining.

40. The system as claimed in claim 31, wherein the processing includes semiconductor link removal, laser trimming, laser drilling or laser etching.

41. The system as claimed in claim 31, wherein the system compensates for system errors that would result in an out-of-round or an out-of-ellipse condition.

42. The system as claimed in claim 31, wherein the first subsystem includes a fixed expander/rotator based on an in-line or compensated offset optical path.

43. The system as claimed in claim 31, wherein the first subsystem includes a plurality of non-offset prism pairs.

44. The system as claimed in claim 31, wherein the first subsystem includes a multi-element, sphero-cylindrical expander.

45. The system as claimed in claim 31, further comprising a filter for filtering the laser beam to obtain an initially modified spot shape.

46. The system as claimed in claim 31, wherein the second subsystem includes an adaptive optical element.

47. The system as claimed in claim 31, wherein the first subsystem includes an adaptive optical element.

48. The system as claimed in claim 31 further comprising a filter for filtering the laser beam to obtain an initially modified spot irradiance profile.

49. The system as claimed in claim 31, wherein the beam delivery and focusing subsystem sequentially positions and focuses the modified beam into a well-focused spot that is scanned along a laser processing path wherein the aspect ratio and orientation of the spot is based on the predetermined dimension and target orientation.

50. The system as claimed in claim 31, wherein the irradiance pattern is an elliptical Gaussian beam.

51. The system as claimed in claim 31, wherein the irradiance pattern is a top hat in one direction and Gaussian in a direction orthogonal to the one direction.

52. The system as claimed in claim 31, wherein the first subsystem includes a first beam expander for shaping the laser beam to obtain an initially modified laser beam having a first elongated irradiance pattern with a first orientation.

53. The system as claimed in claim 52, wherein the first subsystem includes a second beam expander for further shaping the initially modified laser beam to obtain the modified beam having a second elongated irradiance pattern with a second orientation.

54. The system as claimed in claim 53, wherein the second subsystem includes at least one actuator for moving the anamorphic beam expander to control absolute orientation of the devices in response to the orientation control signals.

55. The system as claimed in claim 54, wherein one actuator moves one of the anamorphic beam expander to control relative orientation of the devices in response to the control signals.

* * * * *

UNITED STATES PATENT AND TRADEMARK OFFICE
CERTIFICATE OF CORRECTION

PATENT NO. : 6,777,645 B2
DATED : August 17, 2004
INVENTOR(S) : Jonathan S. Erhmann et al.

It is certified that error appears in the above-identified patent and that said Letters Patent is hereby corrected as shown below:

Column 19,
Line 11, after "first" insert -- anamorphic --.
Line 15, after "second" insert -- anamorphic --.

Signed and Sealed this

Seventh Day of December, 2004

JON W. DUDAS
*Director of the United States Patent and Trademark Office*

UNITED STATES PATENT AND TRADEMARK OFFICE
CERTIFICATE OF CORRECTION

PATENT NO. : 6,777,645 B2
DATED : August 17, 2004
INVENTOR(S) : Jonathan S. Ehrmann et al.

It is certified that error appears in the above-identified patent and that said Letters Patent is hereby corrected as shown below:

Column 19,
Line 11, after "first" insert -- anamorphic --.
Line 15, after "second" insert -- anamorphic --.

This certificate supersedes Certificate of Correction issued December 7, 2004.

Signed and Sealed this

Sixteenth Day of August, 2004

JON W. DUDAS
*Director of the United States Patent and Trademark Office*